United States Patent

Hause et al.

Patent Number: 6,049,133
Date of Patent: Apr. 11, 2000

[54] SEMICONDUCTOR FABRICATION EMPLOYING CONCURRENT DIFFUSION BARRIER AND SALICIDE FORMATION

[75] Inventors: Fred N. Hause, Austin; Mark I. Gardner, Cedar Creek, both of Tex.

[73] Assignee: Advanced Micro Devices, Inc., Sunnyvale, Calif.

[21] Appl. No.: 08/822,121

[22] Filed: Mar. 21, 1997

[30] Foreign Application Priority Data

Jun. 27, 1996 [JP] Japan ................................ 8-167646
Jun. 27, 1996 [JP] Japan ................................ 8-167647

[51] Int. Cl.$^7$ ................................ M01L 21/336
[52] U.S. Cl. ................ 257/767; 438/303; 438/305
[58] Field of Search ................ 257/767, 770, 257/915, 740; 438/303, 305

[56] References Cited

U.S. PATENT DOCUMENTS

| | | | |
|---|---|---|---|
| 4,784,973 | 11/1988 | Stevens et al. | 437/200 |
| 4,994,410 | 2/1991 | Sun et al. | 437/192 |
| 5,043,790 | 8/1991 | Butler | 357/68 |
| 5,242,860 | 9/1993 | Nulman et al. | 437/190 |
| 5,360,996 | 11/1994 | Nulman et al. | 257/767 |
| 5,401,674 | 3/1995 | Anjum et al. | 437/190 |
| 5,610,099 | 3/1997 | Stevens et al. | 437/192 |

Primary Examiner—David Nelms
Assistant Examiner—Michael S. Lebentritt
Attorney, Agent, or Firm—Kevin L. Daffer; Conley, Rose & Tayon

[57] ABSTRACT

An integrated circuit fabrication process is provided in which a metal salicide and a diffusion barrier are formed concurrently. This process includes doping regions of a silicon substrate which are spaced apart by a polysilicon gate conductor, thereby forming source/drain junctions within the substrate upper surface. Oxide spacers are located on opposite sidewall surfaces of the gate conductor. The resulting semiconductor topography is then placed within a chamber having a pressurized and heated nitrogen ambient. A metal, i.e., titanium is deposited upon the semiconductor topography, and then annealing of the metal occurs. The titanium metal reacts with silicon at interfaces not containing nitrogen atoms, i.e., exclusive of the oxide spacers, to form titanium salicide. Concurrent with this reaction is the formation of titanium nitride upon the titanium metal. Finally, aluminum is deposited upon the titanium nitride to complete metallization. The titanium nitride diffusion barrier prevents aluminum spiking of the doped junctions below.

9 Claims, 3 Drawing Sheets

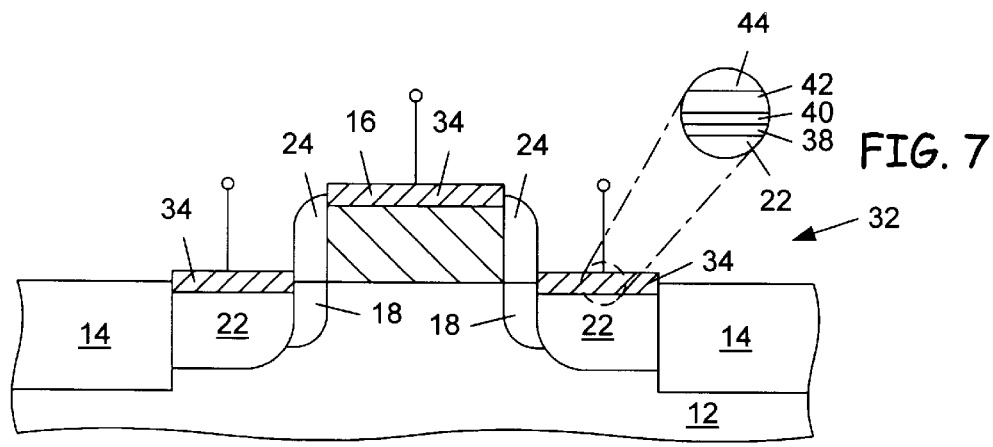
FIG. 7
FIG. 6
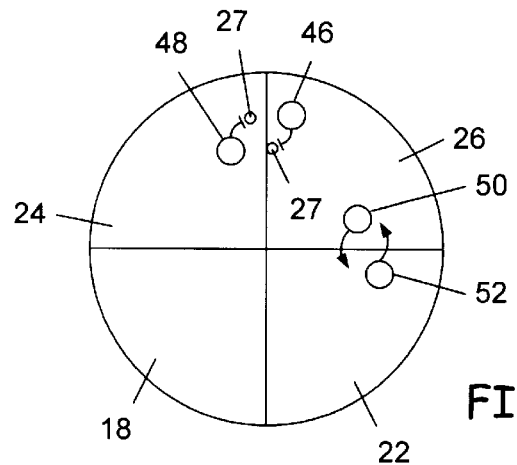
FIG. 8
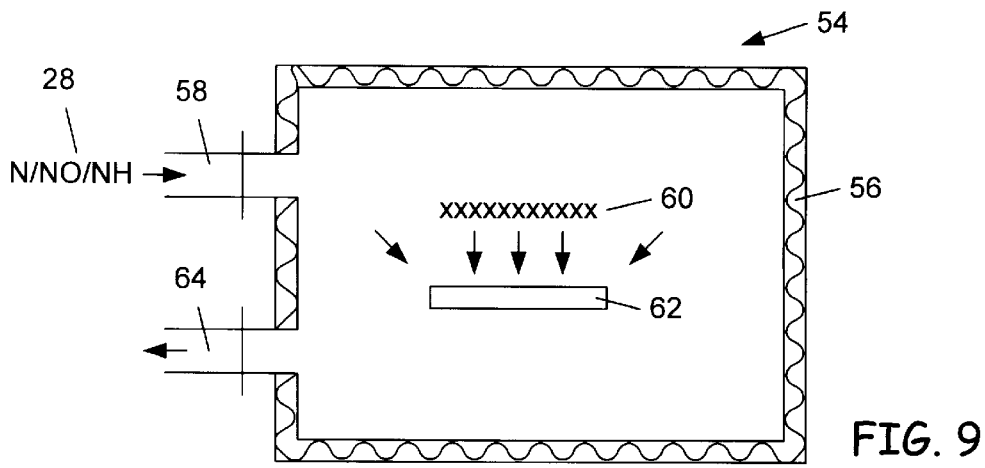
FIG. 9

SEMICONDUCTOR FABRICATION EMPLOYING CONCURRENT DIFFUSION BARRIER AND SALICIDE FORMATION

BACKGROUND OF THE INVENTION

1. Field of the Invention

This invention relates to integrated circuit fabrication and more particularly to the concurrent formation of a diffusion barrier and a salicide within a contact area of the integrated circuit.

2. Description of the Relevant Art

Fabrication of an integrated circuit involves numerous processing steps. After impurity regions have been deposited within a semiconductor substrate and gate areas defined upon the substrate, interconnect routing is placed on the semiconductor topography and connected to contact areas thereon to form an integrated circuit. The entire process of making an ohmic contact to the contact areas and routing interconnect material between ohmic contacts is described generally as "metallization". While materials other than metals are often used, the term metallization is generic in its application. It is derived from the origins of interconnect technology, where metals were the first conductors used. As the complexity of integrated circuits has increased, the complexity of the metallization composition has also increased.

In order to form highly conductive ohmic contacts in the connecting region or "window" between the interconnects (generally aluminum), it is oftentimes necessary to incorporate a layer of refractory metal at the juncture. The refractory metal, when subjected to high enough temperature, reacts with the silicon substrate in the contact window to form what is commonly called a "silicide". The unreacted metal is removed after this formation of the silicide. Silicides are well known in the art and provide dependable silicon contact as well as low ohmic resistance.

Self-aligned suicides on source/drain regions, i.e., "salicides", have increased in popularity due to the shrinking dimensions of conventional transistors. As the contact window decreases in size, it is important that contact resistance remain relatively low. Further, aligning contact windows via a separate masking step makes minimizing source/drain regions impossible. For these reasons, salicides remain a mainstay in semiconductor processing because they are good conductors and they are formed using a self-aligned process. When a metal is deposited and heated on a polysilicon gate and a silicon source/drain area, the silicide reaction occurs wherever the metal is in contact with the heavy concentration, silicon-based underlayer. However, as device dimensions shrink, so does the spacing between contact windows. Any silicide forming in light concentration areas or lateral, silicide migration between closely spaced contact windows must be carefully monitored and controlled. Otherwise, a phenomenon often referred to as "silicide shorting" can occur.

Silicide shorting often arises when the refractory metal is titanium and when titanium silicide is allowed to form between silicon contact windows, such as between a polysilicon gate and silicon source/drain areas, i.e., junctions. In a lightly doped drain (LDD) process, sidewall spacers normally exist on lateral surfaces of the polysilicon to separate the channel from the heavily concentrated source/drain junctions. The sidewall spacers are relatively small in size. Spacers are often made from an oxide material, and hereafter are referred to as "oxide spacers". During titanium silicide formation resulting from annealing in an inert-gas atmosphere (e.g., Ar) at temperatures above 600° C., silicon diffuses into the titanium and then reacts over the oxide spacer regions. Formation of titanium silicide over the oxide spacer regions provides a capacitive-coupled or fully conductive path between the polysilicon gate conductor and the source/drain junctions.

Titanium silicide shorting can, in some instances, be prevented if the anneal cycle is carefully controlled. Many researchers advocate a multiple step salicide forming process. First, a refractory metal such as titanium is deposited over the entire wafer. Next, the metal film is heated to a low temperature in the presence of a nitrogen ambient in order to form a reacted, relatively high-resistance silicide in the contact windows. Next, the unreacted metal is removed using a wet chemical etch (e.g., $NH_4OH:H_2O_2:H_2O$) thereby leaving reacted metal or metal silicide in the contact windows. Finally, a higher temperature anneal is performed in order to produce a lower resistivity silicide.

Two anneal steps are necessary in order to prevent unwanted or excessive silicide formation in regions where silicide should not form, e.g., in the oxide spacer which bears only a relatively low concentration of silicon. In addition, is it important that the anneal steps promote silicide formation in regions where silicon concentration is relatively high, e.g., upon the conductor and the source/drain junctions. If the first anneal temperature is comparable to the second (higher) anneal temperature, then silicon dioxide layers could be consumed and silicide might result. Thus, the first anneal must be maintained at a maximum temperature of approximately 600–700° C., while the subsequent anneal can extend well above 800° C.

This two step anneal process has its share of problems. First, the silicon substrate is removed from the annealing chamber after the first anneal to etch the remaining metal therefrom. This withdrawal of the substrate from the chamber allows native oxides or other impurities to grow or deposit upon the reacted metal silicide which may increase contact resistance in the contact window. Further, if the first anneal temperature exceeds a pre-determined level, unwanted salicidation can occur on oxide spacers. When the contact window contains a heavily doped source/drain region, it is often necessary to increase the first anneal temperature given the relative absence of silicon with respect to impurity atoms.

Aluminum can be easily deposited on the salicide structure to form a contact Unfortunately, with the advent of high density integrated circuits having thinner diffusion junctions, some properties of aluminum have limited the applicability of using it as the sole composition of the metallization layer. After deposition of aluminum, the contact structure is sintered to bring the metal and the silicide into intimate contact Aluminum's ability to dissolve small amounts of silicon or silicon dioxide helps ensure good physical contact or adherence. However, as the temperature of the aluminum-silicon system increases, the solubility of silicon in aluminum rises. In fact, the grain boundaries of the aluminum film allow very fast diffusion of silicon at temperatures above 400° C. Further, as silicon below the aluminum-silicon interface diffuses into the aluminum film, aluminum diffuses into the voids or pits left by the exiting silicon. The amount of this aluminum fill can extend completely through the source/drain junction and provide a conductive path through the junction, rendering the device inoperable. This effect is known as "junction spiking".

In order to prevent such pitting, a thin barrier layer may be placed between the aluminum and silicon to retard cross-diffusion and to resist reaction between silicon and aluminum. An ideal barrier should allow charge carriers to pass freely from the junction to the overlying metallization. A sacrificial barrier is one such barrier. A sacrificial barrier, however, has a finite lifetime and is typically not inert. When a sacrificial barrier is formed between aluminum and silicide, silicon and aluminum diffuse throughout the barrier material and form compounds in the barrier. Eventually, the initial barrier composition no longer exists. Thus, sacrificial barriers provide only a temporary fix to the problem and do not meet the stringent long-term requirements of very large scale integration (VLSI) or ultra large scale integration (ULSI) technology.

Another class of barriers, known as passive barriers, provides nearly an infinite lifetime as opposed to the finite lifetime of a sacrificial barrier. A passive barrier includes a diffusion layer made of an inert material placed between the aluminum and salicide layers. Passive barriers do not substantially react with adjacent aluminum and salicide layers. Salicides, unlike silicon, adhere well to barriers. Titanium nitride is a popular salicide barrier since it exhibits good electrical conductivity, chemical inertness, and strong atomic bonds. The titanium nitride layer can be formed using several different methods, including: sputtering the titanium in a nitrogen ambient; sputtering from a titanium nitride target in an inert ambient; performing a chemical vapor deposition; and evaporating the titanium in a nitrogen ambient.

Conventional methods used to form a barrier over a salicide layer are undesirable. Since the salicide layer is typically formed in a furnace or rapid thermal processing chamber, the device has to be moved to a different chamber before the titanium nitride layer is made. This movement from chamber to chamber exposes the salicide to ambient oxygen and other impurities which may grow on the salicide. It is well known that oxides in the contact window can impede or substantially reduce conductivity within the contact window.

It is therefore desirable that a semiconductor fabrication process be developed which does not require the removal of a silicon device from a chamber during the salicide and barrier formation steps. More specifically, a desirous process is needed whereby a the contact area is not exposed to atmosphere in the interim between silicide and barrier formation. Preventing the exposure of the salicide to ambient oxide is necessary to ensure good ohmic contact at contact windows of the device. Further, it is desirable that nitrogen effectively nitrates the areas of the refractory metal on which the salicide is unwanted but does not do so where salicide is needed. An anneal temperature which does not exceed a specified amount during salicide formation is needed to promote a nitride diffusion into a metal, i.e., titanium. As such, the desired lowered anneal temperature serves to minimize segregation and migration of pre-existing junction implants, especially position-sensitive lightly doped drain (LDD) implants.

SUMMARY OF THE INVENTION

The problems outlined above are in large part solved by the fabrication process of the present invention. That is, a process is provided which simultaneously forms a salicide and a diffusion barrier upon a polysilicon conductor and/or source/drain junction. Moreover, salicidation can occur using a single anneal cycle in nitrogen ambient, wherein particular areas of the refractory metal are nitridized to prevent silicide shorting between the contact windows.

When salicidation occurs at high pressure and in the presence of nitrogen, the metal assumes a significant amount of the nitrogen at the titanium grain boundaries in some areas but not others—depending upon the underlayer composition. The nitrogen occupies the grain-boundary diffusion paths to reduce the diffusivity of lower concentrations of silicon in the titanium, thereby preventing lateral migration of silicide over, e.g., the oxide spacer. Nitrogen substantially nitrates titanium regions that cover the oxide spacers. The nitrogen atoms are used to compete with titanium—silicon bonds which may form over the oxide spacers. Absence of nitrogen atoms near a heavy concentration of silicon (i.e., the polysilicon or silicon junction) will allow minimal nitrogen incorporation which results in a greater silicide formation in those areas.

In an embodiment of the present invention, an integrated circuit is formed via doping regions of a silicon substrate which are spaced apart by a polysilicon gate conductor. Oxide spacers, used to implement an LDD cycle, are preferably located on opposite sidewall surfaces of the polysilicon gate. A metal is preferably deposited upon the implant regions, i.e., the source/drain junctions, in a chamber having a pressurized and heated nitrogen ambient. A salicide and a diffusion barrier are formed simultaneously, within the single chamber, upon the gate conductor substrate and source/drain junctions. After the salicide and barrier have formed, the unreacted metal is removed from the ensuing device. Then an aluminum layer is formed upon the metal silicide.

The metal is preferably deposited upon the implant regions after the chamber is pressurized above atmospheric pressure and heated less than 900° C. In some applications, pressure is defined to exceed approximately 2–3 atmospheres. Ambient nitrogen atoms preferably diffuse into the oxide spacer, where they become primarily arranged for the purpose set forth herein. The nitrogen atoms help prevent silicon atoms and metal atoms from forming metal silicide upon and within the oxide spacers. Further, the nitrogen atoms preferably remain exclusive of the silicon-based topography of the semiconductor device, thereby allowing a metal silicide to form upon and within the silicon-based topography. The preferred metal silicide is titanium silicide due to its low resistivity, and affinity to reducing native-oxide layers. Refractory-metal silicides of W, Ta, Mo, and group-VIII metals are other candidates for self-aligned ohmic contacts.

The diffusion barrier preferably includes titanium nitride which is formed from a nitrogen—titanium reaction. The titanium nitride layer is formed upon, or spaced by titanium from the titanium silicide layer. After the titanium containing little if any titanium silicide is removed from the semiconductor device, aluminum may be deposited onto the titanium nitride layer. The presence of the titanium nitride layer preferably prevents cross-diffusion of the aluminum and the silicide. Further, titanium nitride interposed between titanium silicide and aluminum exhibits good conduction through which charge carriers can pass.

The present invention exhibits advantageous features compared to conventional methods of semiconductor fabrication. A single chamber is used to perform both nitridation and silicidation. The single chamber is not opened during the interim between forming the metal silicide and the barrier. Thus, the salicide layer is prevented from being exposed to ambient oxygen and other impurities that can damage the ohmic properties of the device. Moreover, increasing the pressure of the chamber helps promote use of a lower annealing temperature in the chamber. Therefore, only a single annealing step is required to form a salicide layer since nitridation at the spacer/metal interface is maximized at lower temperatures, yet silicide is encouraged at the junction/metal or gate/metal interface. Further, migration of dopants from the source/drain junctions are minimized as a result of the lower silicide/barrier forming temperatures. Minimizing dopant segregation and diffusion helps prevent dopant depletion at the silicide/junction interface while also minimizing threshold skews. The nitride ambient of the chamber promotes concurrent salicidation and barrier formation.

BRIEF DESCRIPTION OF THE DRAWINGS

Other objects and advantages of the invention will become apparent upon reading the following detailed description and upon reference to the accompanying drawings in which:

FIG. 6 is a cross-sectional view of the semiconductor topography resulting from both nitridation and silicidation of the metal layer.

FIG. 7 is a detailed view along an area of the layers formed as a result of nitridation and silicidation.

FIG. 8 is a detailed view of a section of the semiconductor topography shown in FIG. 5, wherein the interaction of silicon and metal atoms are illustrated at different interface regions.

FIG. 9 is a cross-sectional view of a chamber retrofitted to perform concurrent nitridation and silicidation shown in FIGS. 6 and 7.

Figure 1:
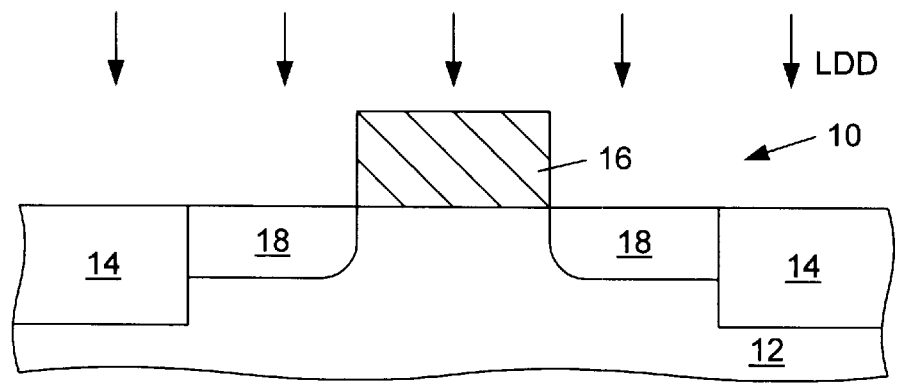
FIG. 1 is a cross-sectional view of a semiconductor topography, wherein a self-aligned lightly doped drain (LDD) implant is forwarded into a semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 illustrates a cross-section of a semiconductor topography 10 having isolation regions 14 formed at select locations across the upper surface of a silicon-based substrate 12. Isolation regions 14 separate certain areas of the silicon-based substrate 12 from structures patterned above isolation regions 14. Isolation regions 14 can be formed using various methodologies. For example, regions 14 result from a fill dielectric disposed in shallow trenches which extend into substrate 12. These shallow trenches are formed via etching away portions of the silicon substrate upper surface. The trench etch and fill technique is often referred to as the shallow trench isolation process. A gate conductor 16, which is preferably composed of polysilicon, is patterned a spaced distance above substrate 12. This spaced distance is dictated by the thickness of a gate oxide which is preferably thermally grown upon substrate 12 and resides between substrate 12 and gate conductor 16. A polysilicon etch process with high selectivity to oxide can be used to ensure that the gate oxide remains partially in place after the polysilicon gate etch is complete. A lightly doped drain (LDD) implant is self-aligned to the gate conductor 16. This implant preferably forms LDD areas 18 within the upper surface of substrate 12. The LDD implant is self-aligned between the lateral edges of the gate conductor 16 and each isolation region 14. LDD area 18 forms lightly doped sections on opposite sides of a channel existing directly below gate conductor 16.

Figure 2:
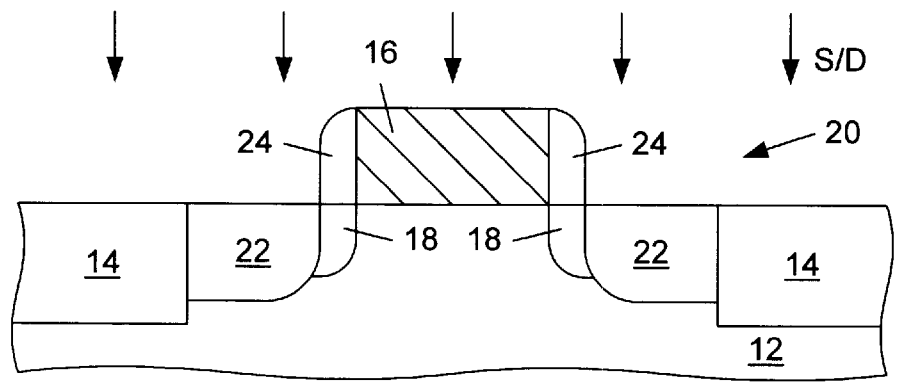
FIG. 2 is a cross-sectional view of the semiconductor topography, wherein a source and drain (S/D) implant is forwarded into a semiconductor substrate a spaced distance from a channel area, subsequent the step in FIG. 1.

Referring to FIG. 2, the semiconductor topography 10 has been transformed by subsequent processing steps to semiconductor topography 20. The steps include forming sidewall spacers, i.e., oxide spacers 24 upon opposite sidewall surfaces of gate conductor 16. Preferably, the spacers 24 are formed via depositing an oxide across the gate conductor 16 and substrate 12. Thereafter, the oxide is anisotropically removed, leaving oxide spacers 24 only on lateral surfaces of gate conductor 16. In addition to forming oxide spacers 24, a source and drain (S/D) implant is forwarded to semiconductor topography 20 to form heavily doped source/drain junctions 22 within the upper surface of substrate 12. The S/D implant is self-aligned between the edges of oxide spacer 24 of gate conductor 16 and each isolation region 14. The heavily doped S/D junctions 22 merge with the LDD area 18 such that the S/D junctions 22 are further away from the channel than the LDD areas which abut the channel. Since the S/D junctions 22 are formed further away from the channel, the depth of junctions 22 can be deeper relative to LDD area 18 without adversely affecting the device operation. This increased depth lowers both the sheet resistance and the contact resistance of S/D junctions 22.

Figure 3:
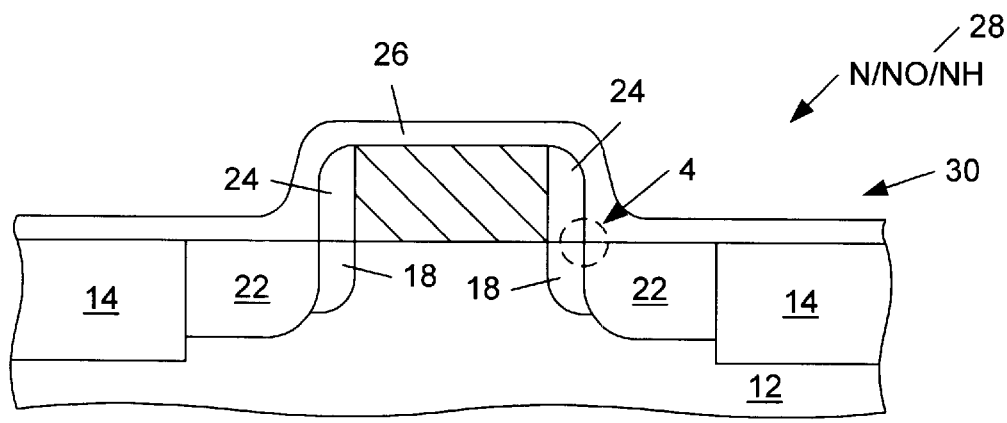
FIG. 3 is a cross-sectional view of the semiconductor topography having a metal layer deposited upon the semiconductor topography according to a process step subsequent to FIG. 2.

As depicted in FIG. 3, a refractory metal 26, is deposited upon semiconductor topography 20 to form semiconductor topography 30. This metal 26 is preferably titanium which, when heated, can form a salicide having a low resistivity. Other metals may be used as well, particularly the group VIII metals which form lower resistivity salicides than many other metals, e.g., tungstein silicide. Titanium metal 26, hereafter referred to as titanium 26, is deposited in a nitrogen ambient 28 for the purpose setforth hereafter.

Figure 4:
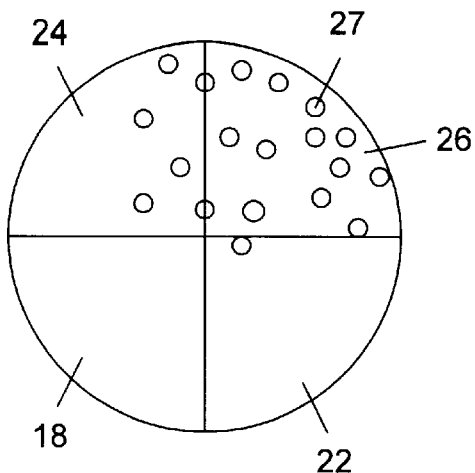
FIG. 4 is a detailed view along section 4 shown in FIG. 3, wherein nitrogen atoms are arranged therein after having diffused into the semiconductor topography.

Referring to FIG. 4, relative concentrations, at an atomic level, of nitrogen are shown. Nitrogen atoms 27 appear distributed throughout a substantial portion of titanium 26 and diffuse somewhat into underlying layers depending on the bond opportunities within those layers. FIG. 4 shows three such underlayers: oxide spacer 24, source/drain junction 22, and LDD area 18. Each underlayer comprises separate and distinct mechanical and chemical properties. For example, oxide spacer 24 has a significant amount of oxygen atoms bonded to silicon atoms. However, oxygen is relatively absent from LDD area 18 and junction 22. Partially for this reason, it is believed nitrogen atoms have a greater affinity to migrate toward and into regions incorporate with oxygen bond sites. This might be due in part to the oxygen-terminated bonds allowing for nitrogen incorporation thereto. Oxygen atoms which are not bonded to a silicon atom can readily bond with nitrogen atoms because the formation of a nitrogen/oxygen bond will allow the oxygen atom to be more chemically stable. Chemical stability herein is referring to sharing of valence electrons to more completely fill the electron valence shells of the nitrogen and oxygen atoms.

It is also believed the bond structure of the oxide within the oxide spacer 24 is less regular, thereby forming an irregular grain structure and avenues into which the nitrogen permeates. These avenues may consist of voids that nitrogen atoms can fill. Further, nitrogen atoms may dislodge silicon or oxygen atoms, thereby becoming substituted within the voids formed therein. Nitrogen atoms 27 may also occupy interstitial positions located between the regular positions of the silicon and oxygen atoms. The resulting oxide spacer 24 which has a substantial amount of nitrogen atoms 27 within its grain boundaries does not allow the entrance of further atoms because it is substantially "stuffed" with nitrogen atoms 27.

On the other hand, properties of LDD area 18 and junction 22 are believed to inhibit nitrogen atoms from migrating therein. For example, LDD area 18 and junction 22 are composed of silicon atoms and impurity dopant atoms, e.g., boron atoms. The dopant atoms and silicon atoms are arranged throughout LDD area 18 and junction 22 in positions which leave them substantially stable. A regular grain structure is present at the junction 22/titanium 26 interface. The process of implanting impurities into a silicon-based substrate involves filling available vacancies and interstitial sites between silicon atoms. Implantation also involves the dopant atoms forcing silicon atoms to move to other sites, thereby replacing the original sites of the silicon atoms. In accordance with this mechanism of implanting impurities, dopant atoms occupy a substantial portion of the space allotted within LDD area 18 and junction 22, thereby leaving virtually no space for nitride atoms 27 to fill. Further, silicon grain boundaries of LDD area 18 and junction 22 are occupied with so many impurity atoms that the grain-boundary diffusion paths are relatively blocked, allowing practically no nitrogen atoms 27 to pass therethrough. Another property of LDD area 18 and junction 22 which encourages a low concentration of nitrogen atoms therein is that nitrogen does not demonstrate an affinity for bonding to silicon or to dopant atoms. Such a bond is generally too unstable to form.

Figure 5:
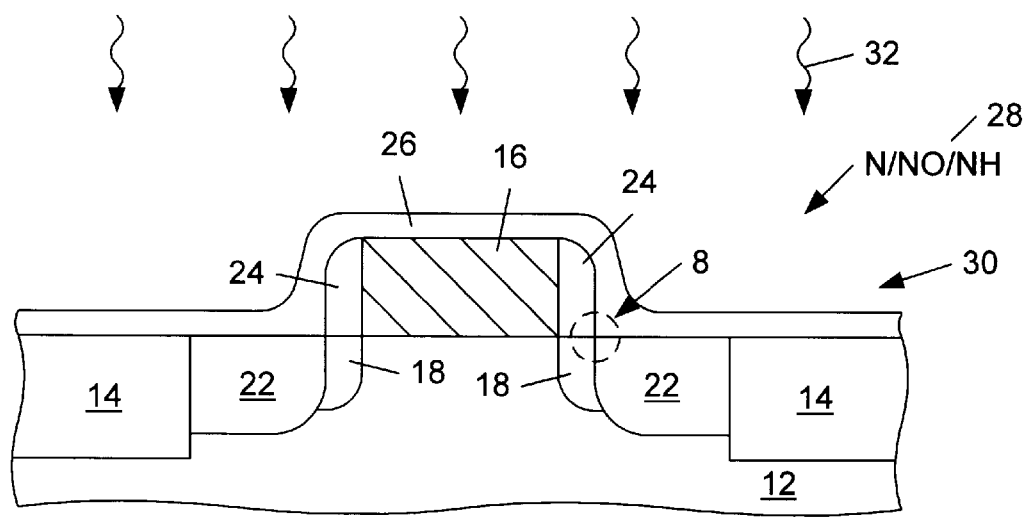
FIG. 5 is a cross-sectional view of the semiconductor topography, wherein thermal energy is supplied to the metal layer deposited in FIG. 3.

Turning to FIG. 5, semiconductor topography 30 is further exposed to thermal energy 32 (anneal at temperature less than 900° C. and pressure above at least one atmosphere, thereby causing silicon and titanium 26 to react at interfaces not occupied by nitrogen atoms. The resulting semiconductor topography 32 is illustrated in FIG. 6 and FIG. 7. Contact windows 34 are formed upon gate conductor 16 and heavily doped junctions 22. These contact windows 34 include a multi-level contact structure. The first portion of the structure includes a titanium salicide layer 38 upon doped silicon 22. As desired, silicon of oxide spacers 24 do not substantially react with the titanium 26 due to nitrogen atoms disposed in the interim. Since silicon within the oxide does not extensively react with the titanium, silicide shorting is minimized.

Exposure to the nitrogen ambient 28 also causes a diffusion barrier, i.e., titanium nitride layer 42 to form upon a titanium layer 40. Concurrent formation of the titanium nitride layer 42 and the titanium salicide layer 38 occurs via the following: nitrogen atoms diffusing into an upper portion of titanium 26 and reacting with the titanium atoms of this upper portion to form titanium nitride layer 42, and silicon atoms simultaneously diffusing into a lower portion of titanium 26 and reacting with the titanium atoms of this lower portion to form titanium salicide layer 38. An unreacted titanium layer 40 preferably remains after undergoing etch since the underlying silicide prevents its removal during etch. Layer 40 lies between the titanium salicide layer 38 and the titanium nitride layer 42 and acts as a "glue" layer by encouraging adhesion between layers 38 and 42. If titanium layer 40 did not remain, titanium nitride layer 42 might not stay fixed to titanium salicide layer 38. It is postulated that titanium salicide layer 38 and titanium nitride layer 42 both have hardly any unbonded titanium atoms to allow the two layers to form bonds therebetween. Since bond structures at the titanium salicide/titanium nitride interface are unlikely, adhesion between the titanium salicide layer 38 and the titanium nitride layer 42 is difficult. The existence of titanium layer 40 gives nitrogen atoms within titanium nitride layer 42 and silicon atoms within titanium salicide layer 38 something to bond to, i.e. titanium. Therefore, adhesion of the titanium nitride layer 42 to semiconductor topography 30 becomes possible. A final step of depositing an aluminum layer 44 upon titanium nitride layer 42 is performed to complete the metallization process.

FIG. 8 further illustrates the mechanism involved in forming titanium salicide exclusive of oxide spacer 24. Silicon atoms 48 within oxide spacer 24 are substantially blocked by nitrogen atoms 27, thereby preventing silicon atoms 48 from diffusing into titanium 26. Further, titanium atoms 46 cannot diffuse into oxide spacer 24 due to nitrogen atoms 27 blocking their diffusion path. Therefore, nitrogen atoms at the spacer/titanium interface prevent titanium and silicon from intermingling/reacting and forming titanium salicide in regions of oxide spacer 24. However, titanium atom 50 and silicon atom 52 of heavily doped junction 22 readily undergo cross-diffusion because nitrogen atoms are not relevant within the junction or at the junction/titanium interface.

Turning to FIG. 9, a chamber 54 is depicted in which the aforementioned concurrent salicide formation and barrier formation takes place is depicted. Compounds containing either nitrogen, nitrogen and oxygen, or nitrogen and hydrogen enter chamber 54 through inlet 58. A titanium target 60 can be used to sputter titanium onto a semiconductor topography which can be placed on a wafer holder 62. Heating coils 56 may heat chamber 54 less than 900° C., and chamber 54 may be pressurized to at least pressures above at least one atmosphere. When the pressure of chamber 54 is increased, a lower annealing temperature may be used to form titanium salicide. A lower annealing temperature is desirable because at temperatures above 900° C., titanium and silicon dioxide of the oxide spacers overcome the nitrogen barriers to form titanium oxides which can degrade device operation via bridging between contact windows. Theoretically speaking, at temperatures above 900° C., nitrogen atoms and titanium atoms compete to form bonds with available oxygen within oxide spacers 24. It is believed that the increased temperature causes titanium to permeate into spacers 24 more quickly than the nitrogen atoms. Therefore, titanium oxide forms at the spacer/titanium interface despite the presence of the nitrogen ambient. In addition to this reason for using lower temperatures, dopant depletion at the silicide/junction interface is prevented at lower temperatures. It is well known in the art that dopant atoms are more likely to migrate from their junction positions at higher temperatures, increasing the resistivity of the source and drain junctions.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A multi-layered contact structure, comprising:

a metal silicide, a metal, and a metal nitride formed concurrent with each other as three separate layers within a common fabrication chamber, wherein the metal silicide is formed upon a silicon-based semiconductor topography and the metal nitride is spaced above the metal silicide by the metal; and an aluminum layer formed upon the metal nitride.

2. The contact structure as recited in claim 1, further comprising a pair of silicon-based semiconductor topographies, and an oxide spacer arranged therebetween.

3. The contact structure as recited in claim 2, wherein one of the pair of silicon-based semiconductor topographies comprises single crystalline silicon and another of the pair of silicon-based semiconductor topographies comprises polycrystalline silicon.

4. The contact structure as recited in claim 2, further comprising a plurality of nitrogen atoms arranged partially within the oxide spacer to minimize transfer of a plurality of silicon atoms and metal atoms from and into, respectively, the oxide so that the plurality of nitrogen atoms substantially prevent formation of metal silicide upon and within only the oxide when subjected to elevated temperatures.

5. The contact structure as recited in claim 2, further comprising a plurality of nitrogen atoms arranged substantially exclusive of the silicon-based semiconductor topography to allow transfer of a plurality of silicon atoms and metal atoms from and into, respectively, the silicon-based semiconductor topography to form said metal silicide upon and within only the silicon-based semiconductor topography when subjected to elevated temperatures.

6. The contact structure as recited in claim 5, wherein said plurality of nitrogen atoms are arranged substantially exclusive of the silicon-based semiconductor topography relative to the oxide spacer.

7. The contact structure as recited in claim 2, wherein said metal silicide, said metal and said metal nitride comprise titanium (Ti).

8. The contact structure as recited in claim 2, wherein said metal silicide, said metal and said metal nitride are formed without removing said silicon-based semiconductor topography from the common fabrication chamber.

9. The contact structure as recited in claim 1, wherein said common fabrication chamber is pressurized to a level exceeding approximately 1.0 atmosphere, and is heated to a temperature less than 900° C.

* * * * *